(12) United States Patent
Staub et al.

(10) Patent No.: US 8,906,491 B2
(45) Date of Patent: Dec. 9, 2014

(54) MULTI-LAYER BODY AND METHOD FOR PRODUCING THE SAME

(75) Inventors: Rene Staub, Hagendom (CH); Walter Kurz, Furth (DE)

(73) Assignee: Leonhard Kurz Stiftung & Co. KG, Furth (DE)

( * ) Notice: Subject to any disclaimer, the term of this patent is extended or adjusted under 35 U.S.C. 154(b) by 1550 days.

(21) Appl. No.: 12/083,132

(22) PCT Filed: Aug. 9, 2006

(86) PCT No.: PCT/EP2006/007860
§ 371 (c)(1),
(2), (4) Date: Apr. 3, 2008

(87) PCT Pub. No.: WO2007/045294
PCT Pub. Date: Apr. 26, 2007

(65) Prior Publication Data
US 2009/0136721 A1    May 28, 2009

(30) Foreign Application Priority Data
Oct. 17, 2005   (DE) .......................... 10 2005 049 891

(51) Int. Cl.
*B32B 5/00*      (2006.01)
*G03F 7/20*      (2006.01)
*G03H 1/02*      (2006.01)
*B44C 1/17*      (2006.01)
*H05K 5/02*      (2006.01)
*G03H 1/00*      (2006.01)
*G03H 1/18*      (2006.01)

(52) U.S. Cl.
CPC ................ *G03H 1/02* (2013.01); *B44C 1/1716* (2013.01); *G03H 1/0236* (2013.01); *G03H 1/0252* (2013.01); *H05K 5/0243* (2013.01); *B24D 2031/12* (2013.01); *B42D 2031/20* (2013.01); *B42D 2033/10* (2013.01); *B42D 2035/22* (2013.01); *B42D 2035/28* (2013.01); *G03H 1/0011* (2013.01); *G03H 1/0244* (2013.01); *G03H 2001/187* (2013.01); *G03H 2001/188* (2013.01); *G03H 2250/10* (2013.01)
USPC .................. 428/195.1; 430/311; 430/318

(58) Field of Classification Search
None
See application file for complete search history.

(56) References Cited

U.S. PATENT DOCUMENTS

| 4,643,912 | A | 2/1987 | Nakagawa et al. |
| 4,759,969 | A | 7/1988 | Sander |
| 6,088,947 | A | 7/2000 | Suzue et al. |

(Continued)

FOREIGN PATENT DOCUMENTS

| CA | 2155850 | | 8/1994 |
| DE | 4307487 | A1 | 10/1993 |

(Continued)

*Primary Examiner* — Mark Ruthkosky
*Assistant Examiner* — Laura C Powers
(74) *Attorney, Agent, or Firm* — Hoffmann & Baron, LLP

(57) ABSTRACT

Described is a multi-layer body (1), in particular a transfer film, having a replication lacquer layer and a metallic layer which is arranged on the replication lacquer layer and which has a plurality of microscopically fine pattern regions (14*m*) and a background region (14*d*) completely surrounding each of the pattern regions (14*m*), wherein the pattern regions (14*m*) are arranged in a raster (14*r*) of the raster width D and the pattern regions are respectively arranged separated from each other at a spacing B by the background region. Also described is a process for the production of such a multi-layer body.

48 Claims, 6 Drawing Sheets

(56) References Cited

U.S. PATENT DOCUMENTS

| | | |
|---|---|---|
| 6,627,286 B1 | 9/2003 | Lutz et al. |
| 7,265,904 B2 * | 9/2007 | Schilling et al. ............ 359/569 |
| 2003/0164243 A1 | 9/2003 | Arakawa et al. |
| 2005/0141094 A1 * | 6/2005 | Wild et al. ................... 359/586 |
| 2006/0164249 A1 | 7/2006 | Lutz et al. |
| 2009/0136721 A1 | 5/2009 | Staub et al. |

FOREIGN PATENT DOCUMENTS

| | | |
|---|---|---|
| DE | 10256832 A1 | 6/2004 |
| DE | 10328760 A1 | 1/2005 |
| DE | 10333704 A1 | 4/2005 |
| EP | 0816123 | 1/1998 |
| EP | 0790123 A3 | 12/1998 |
| JP | 63158245 | 7/1988 |
| JP | 03027999 | 2/1991 |
| JP | 1044308 | 2/1998 |
| JP | 20000117885 | 4/2000 |
| WO | WO 99/48703 | 9/1999 |
| WO | WO0023287 | 4/2000 |
| WO | WO 03095228 A1 * | 11/2003 |
| WO | WO 2004113954 A2 * | 12/2004 |
| WO | 2007045294 | 4/2007 |

* cited by examiner ated on Oct. 17, 2005.

MULTI-LAYER BODY AND METHOD FOR PRODUCING THE SAME

This application claims priority based on an International Application filed under the Patent Cooperation Treaty, PCT/EP2006/007860, filed on Aug. 9, 2006 and German Application No. 102005049891.4, filed on Oct. 17, 2005.

BACKGROUND OF THE INVENTION

The invention concerns a multi-layer body comprising a replication layer having microscopically fine pattern regions, and a process for the production of a multi-layer body of adjustable or defined electrical conductivity.

Metallised multi-layer bodies, in particular metallised films are known, which have a reflective or matt surface or a surface which is structured in some other fashion and which is electrically conductive. The electrically conductive surface can cause a problem, for example when the films are provided for the decoration of housings of electronic devices or when the films are intended to serve as packaging for foodstuffs, which is exposed to the electromagnetic radiation of a microwave oven. Such packagings can at the same time include security features with a metallic surface, which can also be thermally destroyed by microwave radiation.

SUMMARY OF THE INVENTION

The object of the invention is now to provide a multi-layer body of adjustable or defined electrical conductivity, and a production process therefor, which is inexpensive and suitable for mass production.

The object of the invention is now attained a process for the production of a multi-layer body of adjustable or defined electrical conductivity, wherein it is provided that a diffractive first surface structure is shaped in a first region of a replication layer of the multi-layer body, a metallic layer is applied to the replication layer in the first region and in a second region in which the first surface structure is not shaped into the replication layer, wherein either the first region or the second region is formed by a plurality of microscopically fine pattern regions arranged in a line raster or in a surface raster of the raster width D and which are respectively arranged separated from each other at a spacing B by the respective second region or first region which surrounds or delimits completely each of the partial regions, a photosensitive layer is applied to the metallic layer or a photosensitive washing mask is applied as a replication layer, the photosensitive layer or washing mask is exposed through the metallic layer so that the photosensitive layer or the washing mask is exposed differently in the first and second regions due to the first surface structure, and the metallic layer is removed using the exposed photosensitive layer or washing mask as a mask layer in the first region but not in the second region or in the second region but not in the first region.

The object is further attained by a multi-layer body, in particular a transfer film, comprising a replication layer and a metallic layer arranged on the replication layer, wherein it is provided that the multi-layer body has a plurality of microscopically fine pattern regions and a background region surrounding or delimiting completely each of the pattern regions, wherein the pattern regions are arranged in a line raster or in a surface raster of the raster width D, the pattern regions are respectively arranged separated from each other at a spacing B by the background region, the raster width D is less than 500 μm and the ratio of the raster width D to the spacing B is in the range of between 5 and 200, and the metallic layer is present either in the background region or in the pattern regions.

It is therefore provided that, to produce microscopically fine island structures which are oriented on a raster, the metallic layer applied to the surface structure itself forms an optical exposure mask, wherein the optical action of the metallic layer is respectively determined by the surface structure on which it is arranged. In that way it is possible to achieve partial removal in register relationship of the metallic layer functioning as the exposure mask itself, more specifically with the high level of resolution and quality required for production of the microscopically fine island structures.

The term "raster" is used here not just as a uniform subdivision of an area. Rather, irregular or random rasters such as for example frequency-modulated rasters as are used in the printing industry are also embraced by the term "raster". Therefore subdivisions of the area into island regions which are completely stochastically formed are expressly included. The lines between the island regions can also be curved and/or of varying thickness. The raster width D and/or the spacing B can also be mean values of the totality. The arrangement may also involve line rasters, that is to say one-dimensional rasters or multi-dimensional rasters, for example surface rasters.

The invention thus provides a production process for partially metallised multi-layer bodies, in particular partially metallised films with microscopically fine island structures, which is particularly effective and inexpensive.

The following advantages are further achieved by the particular structuring of a multi-layer body according to the invention:

That structuring is not perceptible to the naked human eye. Thus the metallic layer of a multi-layer body according to the invention which is provided with the above-specified arrangement of metallised pattern regions in island form appears to the naked human eye on the one hand as a homogenous metallic surface. On the other hand the metallic layer is electrically non-conductive but is transmissive for electromagnetic radiation down to the microwave range. The multi-layer body can therefore be exposed for example to the radiation of a microwave without noticeably heating up. That means that the multi-layer body according to the invention makes it possible to produce a surface which appears metallic but which is electrically non-conductive. The effect of electrical conductivity can also be made dependent on frequency by virtue of a suitable implementation of the parameters such as for example the raster width D and/or the spacing B of the pattern regions and/or the nature of the raster. That means that electrical conductivity may or may not exist, depending on the respective excitation frequency.

If for example the pattern regions are reflective regions, a multi-layer body in the form of a film is perceived as a metallic mirror film. Such a film can be used for example for decorating electrical devices such as for example television receivers which are to have an electrically non-conducting surface.

On the other hand, a variation in the surface structure makes it possible to produce a transparent film having an electrically conductive surface. Such an electrically conductive film can have for example demetallised pattern regions surrounded by a metallised background region. The film can be used for example as a transparent screening film which, in spite of its transparency, by virtue of the metallised background region which is of a mesh-like nature, is able to screen off electromagnetic radiation or dissipate static electrical charges.

Any electrical conductivities can be adjusted for example by a variation in the layer thickness of the metallic layer or by a variation in the ratio D/B.

If a line raster is provided, by way of example a multi-layer body can be in the form of a film which is insulating in one direction and conducting in another direction.

Advantageous configurations are recited in the appendant claims.

Preferably it can be provided that the raster width D is selected in the range of between 1 µm and 500 µm, preferably in the range of between 5 µm and 300 µm. It can also be provided that the raster width is in the range of between 10 µm and 250 µm. If the raster width D is in those ranges, on the one hand striking diffraction effects in respect of the multi-layer body are avoided and on the other hand the pattern regions are individually not visible as the subdivision is below the resolution limit of the naked human eye.

It can further be provided that the ratio of the raster width D to the spacing B is selected in the range of between 5 and 200. It is possible with the ratio D/B to influence in particular the electrical breakdown strength of the multi-layer body.

It is provided that the metallic layer is applied in a constant density in relation to surface area over the entire area to a plane defined by the replication layer preferably by vapour deposition. Such a process is inexpensive and can be well controlled in respect of the thickness of the metallic layer.

An advantageous configuration provides that the metallic layer is applied to the replication layer over the entire surface area in a thickness at which the metallic layer is of an optical density of between 1 and 7 in a region of the replication layer without a surface structure. The effect of the differing transmission and in particular transparency is adjusted by the depth-to-width ratio, which is described in greater detail hereinafter, of the surface structure of the replication layer. The metallic layer can be a metal, for example aluminium, silver, gold, copper, chromium or palladium or an alloy of those metals or further metals or a layer sequence of the above-specified metals.

It can further be provided that a second surface structure is shaped in the replication layer in the second region and shaped as the first diffractive surface structure in the replication layer is a surface structure which increases transmission and in particular transparency of the metallic layer in the first region with respect to transmission and in particular transparency of the metallic layer in the second region, or vice-versa. It is therefore possible in that way to influence the transmission and in particular transparency or optical density of the metallic layer by means of the surface structure in the replication layer. Just slight differences in transmission or transparency, which are no longer perceptible for example to the human eye, can be adequate with suitable production conditions to use the metallic layer as an exposure mask. Because the replication layer can be produced inexpensively with a very fine surface structure, the required high levels of resolution can be equally inexpensively implemented in partial demetallisation of the metallic layer.

It can be provided that the first surface structure has a greater relief depth than the second surface structure or vice-versa.

In a further configuration it can be provided that the product of spatial frequency and relief depth of the first surface structure is greater than the product of spatial frequency and relief depth of the second surface structure or vice-versa. The spatial frequency is specified in lines/mm and is a characterising feature of diffractive structures. With the preferred raster width of between 5 µm and 300 µm it is advantageously selected to be between 500 lines/mm and 5000 lines/mm. In the case of structures with a stochastic profile such as for example matt structures, the characteristic value used is a typical distance between raised portions or for example what is referred to as the correlation length. That characteristic value is similarly between 0.2 and 2.0 µm.

It can be provided that in the first region a surface structure with a high depth-to-width ratio of the individual structure elements, in particular with a depth-to-width ratio >0.3, is shaped as the first diffractive surface structure, and the second surface structure is in the form of a surface structure with a lower depth-to-width ratio, or vice-versa.

The dimensionless depth-to-width ratio, frequently also referred to as the aspect ratio, is a characterising feature for the surface magnification by preferably periodic structures. Such a structure forms "peaks" and "troughs" in a periodic succession. The spacing between a "peak" and a "trough" is identified here as the depth while the spacing between two "peaks" is identified as the width. The greater the depth-to-width ratio is, the correspondingly steeper are the "peak sides" and the correspondingly thinner is a metallic layer which is deposited on the "peak sides". That effect is also to be observed when the arrangement involves discretely distributed "troughs" which can be arranged at a spacing relative to each other which is a multiple greater than the depth of the "troughs". In such a case the depth of the "trough" is to be related to the width of the "trough" in order correctly to describe the geometry of the "trough" by specification of the depth-to-width ratio.

It is thus possible by means of the depth-to-width ratio to adjust the effective thickness of the metallic layer in the region of the surface structure.

Further advantageous embodiments are directed to the configuration of exposure and development of the photosensitive layers and etching of the metallic layer.

It can be that a photosensitive material with a binary characteristic is applied as the photosensitive layer or the photosensitive washing mask and the photosensitive layer or the photosensitive washing mask is exposed through the metallic layer with an exposure strength and an exposure duration, that the photosensitive layer or the photosensitive washing mask is activated in the first region or second region in which transmission and in particular transparency of the metallic layer is increased due to the first surface structure and is not activated in the second region, or vice-versa.

In that respect it can be provided that the photosensitive layer or washing mask is exposed through the metallic layer by means of UV radiation. UV radiation is more energy-rich than daylight and is therefore preferred in many cases.

Then the regions of the photosensitive washing mask, which are activated by exposure, and the regions of the metallic layer, which are arranged thereon, are removed in a washing process.

It can however also be provided that the exposed photosensitive layer is developed and the developed photosensitive layer forms an etching mask for the metallic layer.

A further advantageous configuration provides that the photosensitive layer is activated by exposure in the first or in the second region in which transmission and in particular transparency of the metallic layer is increased due to the first surface structure, and the activated photoactivatable layer forms an etching means for the metallic layer.

It can be that the photosensitive layer is formed from a photoresist.

The photoresist can be a positive or a negative photoresist.

The photosensitive layer can also be a photopolymer.

It can further be provided that the remains of the etching masks are removed.

A possible starting point for the production of the partially metallised multi-layer body is therefore the metallic layer which is coated with a photoresist. Structuring is effected in typical manner, as described hereinbefore, by exposure of the photoresist, development or etching of the photoresist and etching of the metallic layer with the photoresist as the etching mask. Exposure of the photoresist can be effected for example by:

- a strip exposure device; in that case an exposure mask in strip form is transported in contact with the multi-layer body and the photoresist on the multi-layer body is exposed through the mask;
- controlled exposure with a focused light beam, that is to say a light beam is moved by an actuation unit by means of a deflection unit and optionally an optical focusing means, over the multi-layer body; and
- a mask which is projected onto the multi-layer body by way of an optical imaging means. The process can be in the sense of a "step & repeat" procedure or can be effected by means of a flash lamp actuated in register relationship. In addition the mask can be electronically controlled and variable, for example it can be a "spatial light modulator".

Advantageously, exposure is respectively effected on the photoresist side, but it can also be effected through the metallic layer.

Furthermore, structuring can also be effected by direct laser irradiation (ablation) without the roundabout route by means of a photoresist as an "amplifier". In that respect it is possible directly to make use of the differing absorption characteristics of the metallic layer in regions with different surface structures or in regions with and without surface structures.

In addition structuring can be effected by utilising the structure-dependent etching characteristics of the metallic layer. More specifically, if structured surfaces are vapour-deposited with a metallic layer and exposed to a suitable etching medium, regions with a high aspect ratio appear transparent after a given time while unstructured regions or regions with a low aspect ratio still appear substantially opaque. An etching process which is time-controlled in that way terminates for example when transparency has been produced in regions of the replication layer with a surface relief structure and an effectively thinner thickness in respect of the metallic layer, while in regions of the replication layer without a surface structure and with an effectively thicker thickness in respect of the metallic layer, there is still an opaque metallic layer. Etching of the metallic layer, which also occurs in the unstructured regions, is usually pre-compensated by an optical density, which is increased at the beginning, in respect of the vapour-deposited metallic layer. By way of example a situation of use which can be intended is the provision of a cell phone casing.

It is also possible to provide for a combination with classic demetallisation processes. It can therefore be provided that further regions are completely or partially demetallised by classic demetallisation.

Furthermore one or more layers of the multi-layer body, for example the transfer layer of the transfer film, can be coloured in order to produce a visual impression. In that case, besides the metallic layer, the multi-layer body may also include at least one transparent or opaque coloured layer which is provided partially or over the entire surface area involved. It is particularly preferred in that respect if the at least one coloured layer is formed in register relationship with the metallic layer, in particular being arranged in the first or second region which is free of the metallic layer. That makes it possible to achieve a coloured impression and/or the multi-layer body can be opaque in spite of the partial metallisation. In particular it is preferable if the at least one coloured layer is arranged in the first or second region which is free of the metallic layer and also has a colour similar to the metallic layer. Thus, when a silver metallic layer is involved, a grey layer is preferred or, when a golden metallic layer is involved, a yellowish layer is preferred, which contributes to suggesting to the human eye a reflecting metallic layer which is present without any interruptions.

In that respect it has further proven to be advantageous if the at least one coloured layer is in the form either of an electrically conductive layer which for example contains non-metallic electrically conducting substances such as carbon or polymers, or an electrically insulating layer which for example increases the breakdown voltage. Finally the at least one coloured layer can also be a semiconducting layer. Preferably the at least one coloured layer does not contain any metal.

In particular it has proven to be advantageous if at least two and in particular at least three coloured layers are of differing colours. Preferably the selection is from the colour system CMYK.

It is however also possible to use dyes which are opaque or transparent only in a given wavelength range and which for example act as filters upon exposure with UV light. That makes it possible by means of printing to achieve local structurings in respect of conductivity, which in addition can be influenced by the choice of the spectrum of the light source.

A further advantageous configuration provides that the metallic layer is galvanically reinforced. In that case it is also possible for the layer to be reinforced by a second metal or a metal alloy. After exposure the photoresist is partially removed so that metallic regions of the metallic layer are correspondingly uncovered. Galvanic construction now takes place in the uncovered regions while the regions which are covered with photoresist essentially serve to ensure the electrical conductivity necessary for galvanic construction. The photoresist is then also removed from those regions. The thin metallic layer which has remained in the background region is finally removed by etching.

For the multi-layer body according to the invention it can be provided that the raster is formed with a constant raster width D.

In a further embodiment it can be provided that the raster is formed with a non-constant raster width D.

It can further be provided that the raster width D preferably varies in randomly distributed fashion in a range of ±40%. With such a randomly distributed variation in the raster width it is possible to counteract the occurrence of moiré, and it is possible to avoid diffraction effects which can make themselves troublesomely noticeable under some circumstances in the case of rasters involving a constant raster width.

It is however also possible to provide for the generation of a moiré effect if a particular optical action is to be achieved therewith.

The first or second surface structure can be in the form of an optically active, reflecting or transmitting light-diffracting and/or light-refracting and/or light-scattering micro- or nano-structure, for example in the form of a grating structure such as a linear grating or cross grating, a superimposition of a plurality of grating structures, an isotropic or anisotropic matt structure, a binary or continuous Fresnel lens, a microprism, a blaze grating, a combination structure or a macrostructure. Numerous optical effects of interest can be formed in that way. It is therefore possible for a metallically appearing hologram or KINEGRAM® to be made electrically non-conducting. The reflection capability is only slightly reduced by the partial demetallisation so that the hologram is perceived substantially with the same level of intensity as an electrically conducting version. As the rastering is below the resolution limit of the naked eye, it remains concealed to the human viewer if the rastering is so selected that no moiré effects occur with design elements of the hologram. Even upon evaluation by machine no losses of quality are to be feared.

By virtue of a local variation in the rastering, the transmission characteristics of the non-conducting mirror film can be markedly perceptibly changed while the reflection characteristics only imperceptibly vary. When viewed in incident light therefore no information is perceptible while when viewed in a transmitted light for example it appears in the form of an graphic representation. It can further be provided that the multi-layer body has a second metallic layer which is arranged in register relationship with a first metallic layer and/or the at least one coloured layer. That makes it possible to produce further effects which are of interest.

The metallic layers can be of differing thicknesses, whereby on the one hand it is possible to further control the electrical properties of the multi-layer body and on the other hand the optical properties of the multi-layer body.

Thus it can be provided that at least one of the metallic layers is applied in a layer thickness at which it is partially transparent in the visible range. The layer thickness to be selected for that purpose is dependent on material. Layer thicknesses of some 10 nm can already appear to be opaque, that is to say non-transparent. By way of example aluminium appears opaque when its optical density is in the range of between 1 and 5. It is further determined by the depth-to-width ratio of the surface structure of the replication layer, on which the metallic layer is deposited.

In spite of the optical transparency the metallic layer can also involve an electrical conductivity which is adequate for many situations of use. It can be provided for example that such a multi-layer body which is in the form of a film is used for screening electromagnetic radiation or for dissipating static electrical charges. The multi-layer body can therefore be used inter alia as packaging film for components which are sensitive to static charges, such as for example microprocessors. It can also be provided that such a film is formed only with a metallic layer, as described hereinbefore.

It can further be provided that the spacing between the metallic layers is so selected that interference effects occur. For that purpose the metallic layers are arranged at the $(2n+1) \cdot \lambda/2$- or $(4n+1) \cdot \lambda/4$-spacing, wherein n is an integer including 0 and $\lambda$ is the wavelength of the light. The interference at thin layers causes colour changes to be produced, as are known for example from films of oil on water surfaces. Interesting optical effects can be produced in that way, which for example can serve decorative purposes or can form a security feature which is difficult to imitate.

Further advantageous embodiments are directed to the configuration of the surface structure, which permit the generation of further optical effects.

It can be provided that the metallic layers have a different first surface structure and/or second surface structure and/or that their first regions and/or their second regions are arranged differently. The pattern regions of the two metallic layers can be arranged for example in mutually displaced relationship in a chessboard-like fashion and can be formed with differently coloured metals, for example aluminium and copper. In that respect the pattern regions of a layer can also form groups which by virtue of their dimensions can be perceived by the human eye. The groups could involve for example pixels which are overall arranged to afford a graphic or text representation.

It can further be provided that the first surface structure and/or the second surface structure is an optical-diffraction surface structure, for example a hologram, a Kinegram® or the like. In that way it is possible for example for a metallised hologram or Kinegram® to be provided with an electrically non-conducting surface or reflection layer. It can therefore be applied as a security feature to foodstuffs packagings which together with their content are to be exposed to microwave radiation in a microwave. It is however also possible for such security features to be applied to documents or banknotes and for authenticity checking to be implemented by microwave irradiation. It is possible in that way for imitated security features to be identified and at the same time destroyed.

It can further be provided that the first surface structure and/or the second surface structure is a matt structure. It has been stated hereinbefore that the process according to the invention makes it possible to produce mirror films having an electrically non-conducting surface. The surface structure of the metallised regions in island form however can also be in the form of a matt structure or can be of some other design configuration in order to imitate the varied optical impression of metallic surfaces, for example brushed surfaces with a matt metal shine. The metallic reflection layer can also be covered with further transparent or coloured layers.

In a further advantageous configuration the pattern region and/or the background region can be structured in the form of a microtext or a micrographic. The microtext or the micrographic can form a security feature which is not perceptible with the naked human eye and which can only be imitated with difficulty.

The microtext or the micrographic or a bar code can be in the form of metallised or non-metallised sub-regions. Therefore for example non-metallised sub-regions can be formed in a metallised pattern region, insofar as there a different surface structure is shaped in the replication layer, from that in the pattern region itself. In that case the envelope curve of the other surface structure forms the edge contour of the microtext or the micrographic. It may however also involve a metallised sub-region which differs in terms of its optical effect from the pattern region surrounding it, that is to say for example it appears due to a colour change when the film is tilted or tipped. Similarly microtext or micrographic can be introduced into the background region, in which case it can advantageously be provided that metallised microtext or micrographic are separated by non-metallised regions from the metallised pattern regions when the film is to be formed with a non-conducting surface.

It can further be provided that the pattern regions and/or the background region are sub-structured in the form of a concealed pattern which can be seen through a moiré verifier, that is to say a separate verification plate. Such a security feature can also be imitated only with difficulty.

Further possible situations of use of the multi-layer body according to the invention, besides those already described hereinbefore, can be as follows:
  OLEDs,
  sensor means, for example sensors with sensitive layers which react sensitively to moisture, oxygen, light, heat, cold and so forth,
  security elements with conductive structuring which can be checked by means of detectors,
  printed circuit boards, and
  electronic components It is possible for that purpose to provide further functional layers which optionally are only partially shaped, such as semiconductor layers, insulator layers, sensitive layers or similar, in the multi-layer body, which layers have optical and/or electrical properties.

Numerous further applications and/or additional effects are possible such as for example:
- implementation of specific test points on the surface of the multi-layer body, which allow checking of electrical conductivity,
- variation in thickness of the metallic layer,
- exposure with polarised light,
- frequency-dependent implementation of the parameters of the partially metallised regions, and
- addition of further electronic components to the multi-layer body which has structured electrical conductivity.

BRIEF DESCRIPTION OF THE DRAWINGS

The invention is described by way of example hereinafter by means of a number of embodiments with reference to the accompanying drawings in which.

DETAILED DESCRIPTION OF THE INVENTION

Figure 1:
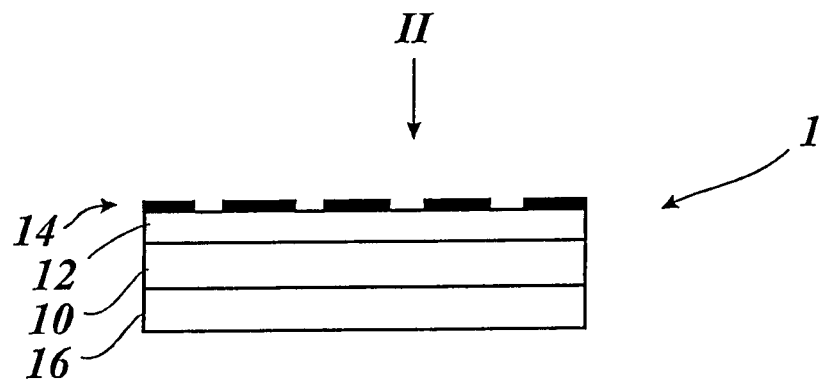
FIG. 1 shows a diagrammatic view in section of a first embodiment.

FIG. 1 shows a multi-layer body in the form of a multi-layer film body 1 which can be a hot stamping film. A replication layer 12 is applied to a carrier film 10 which can be formed from a polyester film which is about 20 μm in thickness. The replication layer 12 can be a thermoplastic layer in which a pattern is shaped by means of a replication tool. It can however also involve a UV-hardening lacquer in which the pattern is formed by mask exposure by means of UV light or is produced by shaping from a template with a surface structure.

The replication layer 12 carries a partially apertured metallic layer 14 which can comprise for example aluminium, copper, silver, gold or chromium. As the last layer, applied to the side of the carrier film 10 that is remote from the replication layer 12, is an adhesive layer 16, by means of which the film body 1 can be transferred onto a substrate. The adhesive layer 16 can preferably be a hot melt adhesive.

As a further variant the adhesive layer 16 can also be applied to the metal layer. In particular the composite assembly consisting of the replication layer, the metal layer and the adhesive layer can be in the form of a transfer layer assembly which is stuck onto a substrate, in which case the carrier 10 can then be pulled off.

Figure 2:
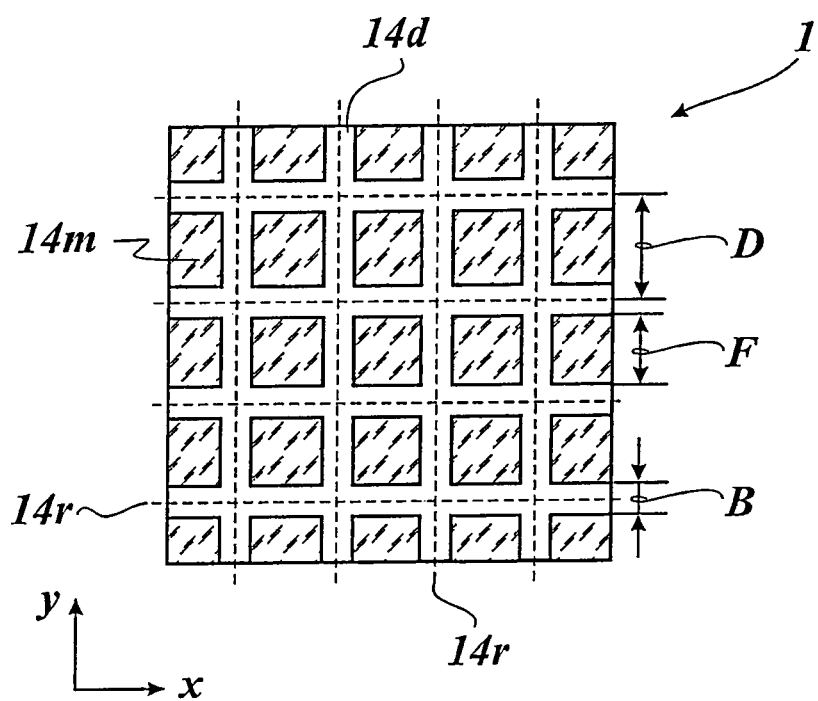
FIG. 2 shows a diagrammatic plan view of the first embodiment.

FIG. 2 now shows a plan view illustrating in detail the configuration of the metallic layer 14. The metallic layer 14 is divided into regions 14m in island form, which are each surrounded by demetallised regions 14d of the replication layer 12, of a width B. The demetallised regions 14d form an interconnected background region. The regions 14m are arranged in a grid or raster of a raster width D, wherein the raster lines are denoted by reference 14r. In the FIG. 2 embodiment they are in the form of square areas of an edge length F which is less than the raster width D:

$$F = D - B$$

The raster width D and the ratio of the raster width D to the width B are now selected that the structuring of the metallic layer 14 is not visible to a naked human eye. In that respect the following boundary conditions are to be observed:
- the smallest admissible value for the ratio of the raster width D to the width B is determined by the maximum electrical flash-over voltage which occurs, in which respect it is to be borne in mind that external influences such as humidity in the air, perspiration on the hand and contamination or soiling can reduce the insulation effect of the demetallised regions 14d. In addition the flash-over voltage is determined by possible, deliberately applied dielectric cover layers. Those cover layers can comprise pieces of the film 1, such as for example replication layer or adhesive.
- the smallest admissible value for the raster width D is limited by diffraction effects which can occur at structures of the order of magnitude of the light wavelength and can destroy the impression of a closed metallic surface, or respectively generate unwanted colour effects.
- the greatest admissible value for the width B and/or the raster width D is limited by the resolution of the human eye. If the raster width D and/or the width B are selected to be excessively great, the rastering can be seen by the naked eye.

The metallised regions 14m can be in the form of reflecting surfaces so that the film body 1 appears as a mirror film. It is however also possible for optical-diffraction structures to be introduced into the regions 14m, for example a hologram, or it is possible to provide matt structures. Varied optical effects can be produced in that way, which go beyond the reproduction of an optically unitary metallic surface. By way of example "metallic" microwave-compatible security features, logos or labelling or marking can be applied to packs for ready-made meals, which are not destroyed upon being heated in a microwave, because these are electrically non-conducting metallic surfaces. Security elements as are used on documents and banknotes can be provided in that way with an additional security feature which provides that such a security feature cannot be destroyed by microwave radiation. In addition electronic devices such as television receivers can be provided with an electrically non-conducting metallic surface. In that case the metallic layer does not have to be at the physical surface, but can also be embedded between dielectric layers, for example as part of a transfer layer assembly or by injection moulding in production of the housing components.

Although the raster of the embodiment shown in FIG. 2 is a square raster, the raster width D of which is the same in the co-ordinate directions x and y, it can however also be provided that the raster width D is different in the direction of the x-co-ordinate and the y-co-ordinate. Equally the edge length F of the metallised region 14m and/or the width B of the demetallised region 14d can be different. The metallised regions 14m can be rectangular, circular, elliptical or otherwise shaped regions of a closed contour. In the case of a square raster as shown in FIG. 2, squares, circles and regular polygons can be preferred as the contour of the metallised regions.

It can also be provided that metallised regions 14m in line form are produced, which are separated from each other by demetallised regions 14d in line form. The metallised regions 14m are consequently arranged in a line grid or raster, that is to say in a one-dimensional raster. Such a film body is consequently insulating in a direction extending perpendicularly to the regions 14m, 14d in line form, and is conductive in a direction extending parallel to the regions 14m, 14d in line form.

Figure 3:
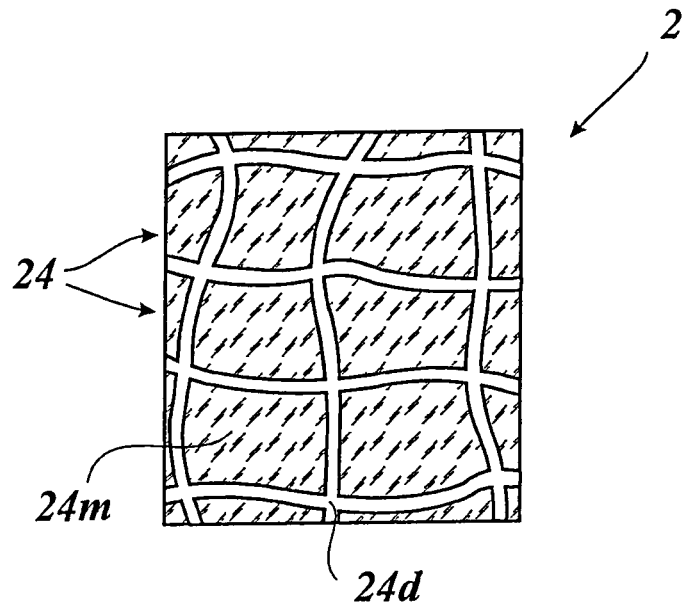
FIG. 3 shows a diagrammatic plan view of a second embodiment.

FIG. 3 now shows a second embodiment in which the raster width varies randomly by ±40% around the value $D_0$. FIG. 3 involves a film body 2 which is shown in plan and in which both the metallised regions 24m and also the demetallised regions 24d are irregularly shaped, wherein the deviations from a square raster are no greater than 40%. With such a design configuration it is possible for example to prevent the occurrence of moiré effects or troublesome diffraction effects.

Figure 4:
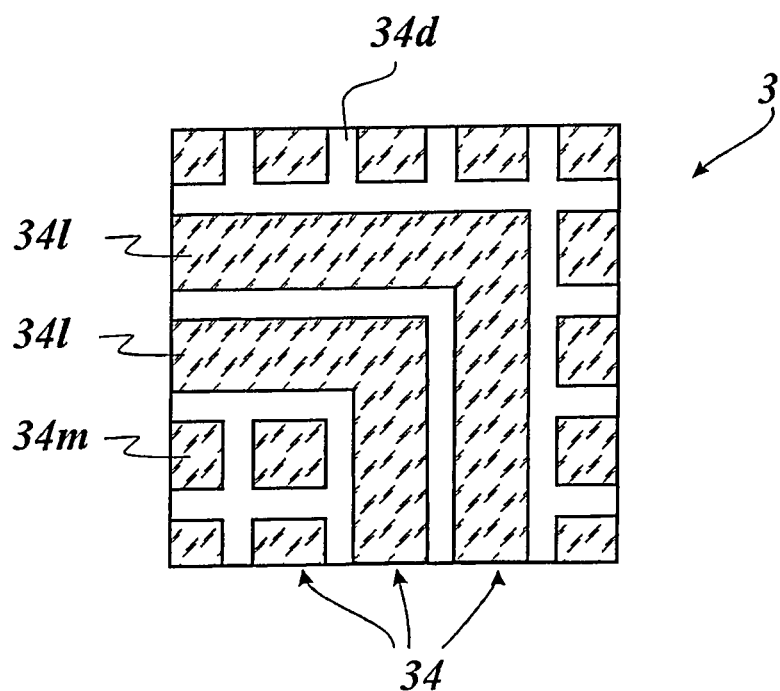
FIG. 4 shows a diagrammatic plan view of a third embodiment.

FIG. 4 shows a diagrammatic view of a third embodiment formed by a variation in the first embodiment shown in FIG. 2. FIG. 4 shows a film body 3 having demetallised regions 34d and metallised regions 34l and 34m.

A metallic layer 34 is now structured in such a way that, besides mutually insulated metallic regions 34m, regions of the metallic layer 34 are connected together and thus form conductor tracks 34l. It is possible in that way to form for example antennae which are not visible to the naked human eye. Because the replication layer arranged under the metallised regions 34m, 34l can have an optical-diffraction relief structure, for example in the form of a hologram, it is also possible in that way for security elements to be provided with electrical functional elements. The film body of such a security feature can have further layers which for example form an RFID tag, that is to say a circuit serving for identification by means of radio waves. Furthermore the background region, that is to say between the metallised regions 34m, 34l, can be filled up with an opaque coloured layer.

Figure 5:
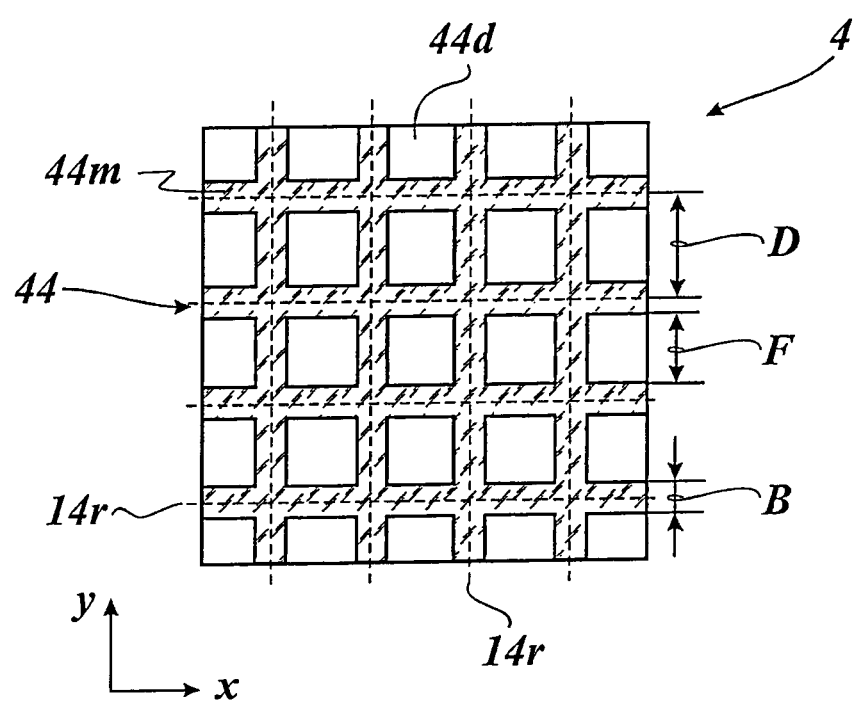
FIG. 5 shows a diagrammatic plan view of a fourth embodiment.

FIG. 5 now shows a fourth embodiment in which a metallic layer 44 applied to a film body 4 is in the form of a substantially transparent electrically conductive layer. Now, in comparison with the first embodiment shown in FIG. 2, demetallised regions 44d in island form are surrounded by metallised regions 44m in strip form, which are connected together and in that way form a continuous electrically conducting surface region. That surface region is in the form of a close-mesh network. The metallic layer 44 can be used for example as screening in relation to electromagnetic fields or for dissipating static charges.

It can also be provided that arranged on the metallic layer 44 are further layers, for example a protective lacquer layer or a coloured layer, without adversely affecting the screening effect. Furthermore the film body 4, in the demetallised regions 44d, can have a transparent coloured layer in register relationship with the metallic regions 44m in strip form. For better orientation purposes, the raster lines 14r are shown in FIG. 5 (see FIG. 2).

Figure 6:
FIG. 6 shows a diagrammatic view in section of a fifth embodiment.

FIG. 6 now shows a film body 5 comprising a carrier layer 50, a first replication layer 52a, a first metallic layer 54a, a second replication layer 52b, a second metallic layer 54b and an adhesive layer 56. The two metallic layers 54a and 54b are arranged at such a spacing from each other that the known interference effects at thin layers can occur. The two metallic layers 54a and 54b are also of differing thicknesses. In the FIG. 6 embodiment the metallic layer 54a arranged closer to the carrier layer 50 is the thinner layer. It is of a thickness in the lower nanometer range so that it appears partially transparent in visible light. Because the transparency of a thin metal layer is inter alia material-dependent the required layer thickness is desirably determined by a series of tests.

Figure 7:
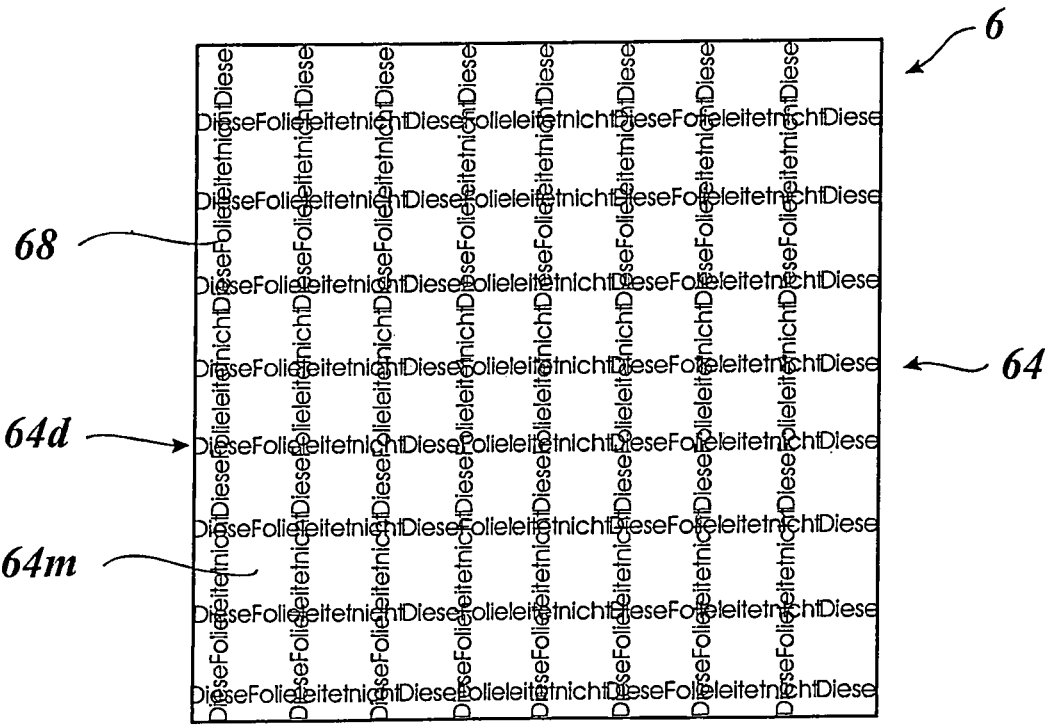
FIG. 7 shows a diagrammatic plan view of a sixth embodiment.

FIG. 7 shows a plan view of a film body 6 in which the surface has metallised regions 64m in island form, which are surrounded by demetallised regions 64d, in the fashion already described hereinbefore. Introduced into the regions 64d is a microidentification which in the illustrated embodiment is in the form of microtext which is readable only with an optical accessory such as a strong magnifying glass or a microscope. It is however also possible to provide micrographics. The microidentification however can reduce the electrical flash-over resistance of the demetallised regions 64d insofar as it has a metallised surface.

The described embodiments include the partial demetallisation of the metallic layer being effected in register relationship. That is readily possible because the metallic layer is arranged on the replication layer which at least region-wise involves a surface profile. If now the system involves applying to the replication layer a metallic layer of a uniform density in relation to surface area, with respect to the plane defined by the replication layer, for example by vacuum vapour deposition, the density in relation to surface area or the layer thickness can be so selected that the metallic layer applied has a differing optical density in dependence on the local depth-to-width ratio of the surface profile. If now the metallic layer is used as an exposure mask for a photoresist, that is to say the photoresist is exposed through the metallic layer, it can be developed as an etching mask with accurate registry, and the metallic layer can be partially demetallised in accurate register relationship.

If the metallised regions are to be in the form of reflecting regions, a surface profile with a high depth-to-width ratio can be shaped in the regions of the replication layer, that are arranged under the demetallised regions, for example with a depth-to-width ratio >2, and the replication layer, under the metallised regions, can have a very low depth-to-width ratio.

The dimensionless depth-to-width ratio, frequently also referred to as the aspect ratio, is a characterising feature in respect of surface magnification of preferably periodic structures. Such a structure forms "peaks" and "troughs" in periodic succession. Here the spacing between a "peak" and a "trough" is referred to as the depth while the spacing between two "peaks" is referred to as the width. The greater now the depth-to-width ratio, the correspondingly steeper are the "peak sides" and the correspondingly thinner is a metallic layer deposited on the "peak sides". That effect is also to be observed when the situation involves discretely distributed "peaks" which can be arranged at a spacing relative to each other which is a multiple greater than the depth of the "troughs". In such a situation the depth the depth of the "trough" is to be related to the width of the "trough" in order to correctly describe the geometry of the "trough" by specifying the depth-to-width ratio.

It is therefore possible for the mean layer thickness of the metallic layer to be influenced by the depth-to-width ratio h/d of the surface profile of the replication layer. That influences on the one hand the conductivity of the metallic layer and on the other hand the transmission or transparency thereof.

Table 1 shows the ascertained degree of reflection of metal layers of Ag, Al, Au, Cr, Cu, Rh and Ti, arranged between plastic films (refractive index n=1.5), at a light wavelength $\lambda$=550 nm. In this case the thickness ratio $\epsilon$ is formed as a quotient from the thickness t of the metal layer, that is required for the degree of reflection R=80% of the maximum $R_{max}$ and the thickness t required for the degree of reflection R=20% of the maximum $R_{max}$.

TABLE 1

| Metal | $R_{max}$ | t for 80% $R_{max}$ | t for 20% $R_{max}$ | $\epsilon$ | h/d |
|---|---|---|---|---|---|
| Ag | 0.944 | 31 nm | 9 nm | 3.4 | 1.92 |
| Al | 0.886 | 12 nm | 2.5 nm | 4.8 | 2.82 |
| Au | 0.808 | 40 nm | 12 nm | 3.3 | 1.86 |
| Rh | 0.685 | 18 nm | 4.5 nm | 4.0 | 2.31 |
| Cu | 0.557 | 40 nm | 12 nm | 3.3 | 1.86 |
| Cr | 0.420 | 18 nm | 5 nm | 3.6 | 2.05 |
| Ti | 0.386 | 29 nm | 8.5 nm | 3.3 | 1.86 |

From heuristic consideration, as can be seen, silver and gold (Ag and Au) have a high maximum degree of reflection $R_{max}$ and require a relatively low depth-to-width ratio for forming transparency. Aluminium (Al) admittedly also has a high maximum level of reflection $R_{max}$ but it requires a higher depth-to-width ratio. Preferably it can therefore be provided that the metal layer is formed from silver or gold. It can however also be provided that the metal layer is made of other metals or metal alloys.

Table 2 shows the calculation results, obtained from strict diffraction calculations for surface structures, in the form of linear sinusoidal gratings, with a grating spacing of 350 nm, with different depth-to-width ratios. The surface structures are silver-coated with a nominal thickness $t_0$=40 nm. The light impinging on the surface structures is of a wavelength $\lambda$=550 nm (green) and is TE-polarised and TM-polarised respectively.

TABLE 2

| Depth-to-width ratio | Grating spacing in nm | Depth in nm | Degree of reflection (OR) TE | Degree of transparency (OT) TE | Degree of reflection (OR) TM | Degree of transparency (OT) TM |
|---|---|---|---|---|---|---|
| 0 | 350 | 0 | 84.5% | 9.4% | 84.5% | 9.4% |
| 0.3 | 350 | 100 | 78.4% | 11.1% | 50.0% | 21.0% |
| 0.4 | 350 | 150 | 42.0% | 45.0% | 31.0% | 47.0% |
| 1.1 | 350 | 400 | 2.3% | 82.3% | 1.6% | 62.8% |
| 2.3 | 350 | 800 | 1.2% | 88.0% | 0.2% | 77.0% |

As can be seen in particular the degree of transparency, apart from the depth-to-width ratio, is dependent on polarisation of the incident light. That dependency is shown in Table 2 for various depth-to-width ratios h/d.

It can also be seen that the degree of transparency or the degree of reflection of the metal layer is wavelength-dependent. That effect is particularly highly pronounced for TE-polarised light.

It has further been seen that the degree of transparency falls if the angle of incidence of the light differs from the normal angle of incidence, that is to say the degree of transparency decreases when the light is not perpendicularly incident. That signifies that the metal layer can be of a transparent nature, in the region of the surface structure, only in a limited cone of incidence of the light. It can therefore be provided that the metal layer is opaque when viewed inclinedly, in which case that effect can be used for using the metal layer as a selective exposure mask.

Figure 8:
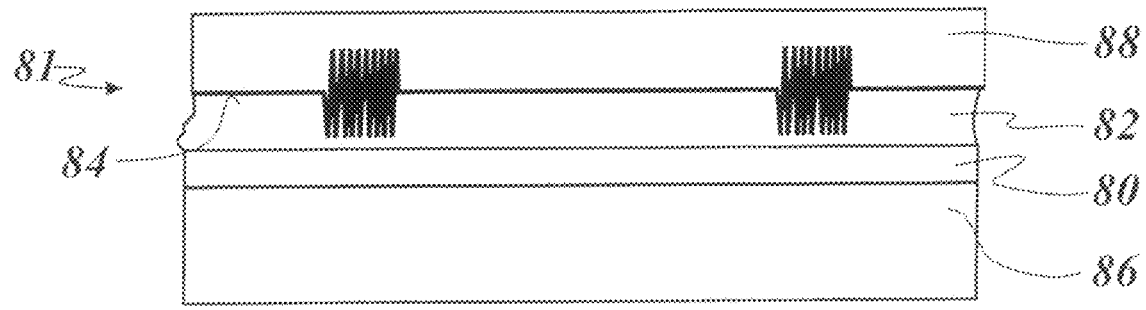
FIG. 8 shows a diagrammatic view in section of a production stage for the first embodiment.
Figure 9:
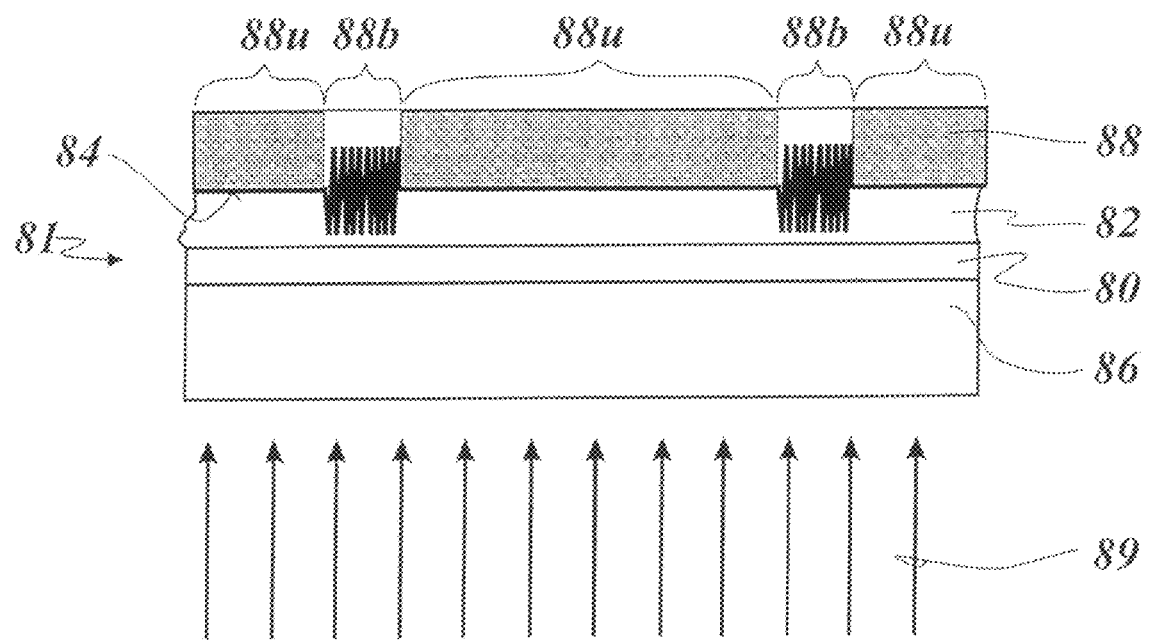
FIG. 9 shows a further production stage as shown in FIG. 8.
Figure 10:
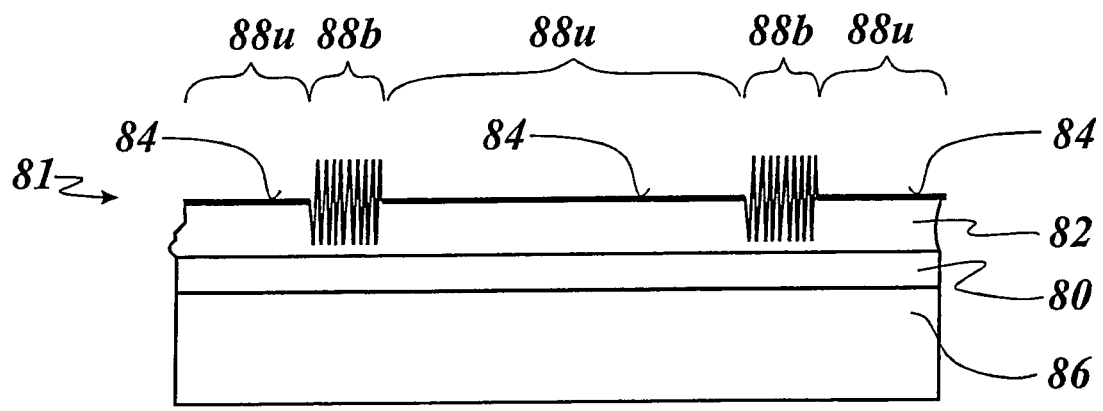
FIG. 10 shows the last production stage as shown in FIG. 8.

FIGS. 8 to 10 now show an embodiment for the production of a metallic layer which is partially demetallised in accurate register relationship.

FIG. 8 shows a multi-layer film body 81 which is constructed like the film body 1 described with reference to FIG. 1. The film body 81 comprises a plurality of layers. In the illustrated embodiment this involves a carrier film 80, a replication layer 82 and a metallic layer 84, as well as an adhesive layer 86 applied to the side of the carrier film 80, that is remote from the replication layer 82.

A photosensitive layer 88 is applied to the metallic layer 84.

The photosensitive layer 88 can be for example a UV-sensitive photoresist. That can be an organic layer which is applied by classic coating processes such as intaglio printing in fluid form. It can also be provided that the photosensitive layer is applied by vapour deposition or is laminated on in the form of a dry film.

FIG. 9 shows exposure of the photosensitive layer 88 from the side of the adhesive layer 86, the photosensitive layer 88 being shown in the developed state.

Exposure of the photosensitive layer 88 is intended with UV light 89, the metallic layer 84 acting as an exposure mask. After development the photosensitive layer 88 has regions 88u, in which the layer 88 is contained, and regions 88b in which the layer 88 has been removed as a consequence of development. As can be seen from FIG. 9 the regions 88u are regions in which the replication layer 82 is formed with a lower depth-to-width ratio—in the illustrated embodiment it is zero—while in the regions 88b the replication layer 88 has a surface structure with a high depth-to-width ratio. There, the metallic layer 84 is formed with a smaller thickness than in the regions 88u so that the metallic layer 84 involves differing transmission in the two regions and thus the incident UV light is attenuated to differing degrees. There is no need for the metallic layer to be so thin that the regions 88b appear transparent when viewed visually. A relatively low level of overall transmission in respect of the film body 81 can be compensated by an increased exposure dose for the photosensitive layer 88. It is also to be borne in mind that exposure of the photosensitive layer is typically intended in the near UV range so that the visual viewing impression is not crucial for assessing transmission.

In the embodiment shown in FIGS. 8 to 10 the photosensitive layer 88 is formed from a positive photoresist. In the case of such a photoresist the exposed regions are soluble in the developer. In contrast thereto, when using a negative photoresist, the unexposed regions are soluble in the developer. It is possible in that way to demetallise different regions of the metallic layer 84 in accurate register relationship, with one layout. It can further be provided that the metallic layer 84 is further modified by means of a subsequent galvanic treatment, for example to produce it with an increased layer thickness in order for example to provide conductor tracks, as shown hereinbefore in FIG. 4, which enjoy improved electrical conductivity.

FIG. 10 now shows the film body 81 in its final state after the metallic layer 84 has been removed in the regions 88b by means of an etching agent. The metallic layer 84 is therefore only still present in the regions 88u and in that way forms mutually electrically insulated islands.

Figure 11:
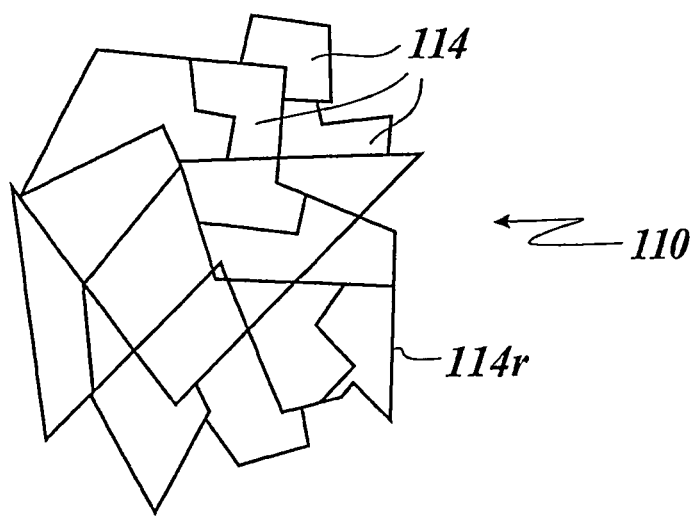
FIG. 11 shows a diagrammatic plan view of a seventh embodiment.

FIG. 11 now shows a multi-layer body 110 which is randomly sub-divided into island regions 114. Accordingly raster lines 114r are also formed and arranged randomly. In the FIG. 11 embodiment the raster lines 114r are in the form of straight lines. In that respect however they may also involve curved lines. In addition it can be provided that the lines are of varying width. In order to be able to use the dimensioning formula F=D−B described hereinbefore with reference to FIG. 2 or to be able to determine the ratio D/B, the raster width D and the width B are ascertained as mean values over all the island regions 114. As described hereinbefore with reference to FIG. 3 it can preferably be provided that the variation in the raster width D<±40%.

The shape and size of the island regions 114 can vary in a wide range, and likewise the position of the centroids of the island regions. Nonetheless it is provided that the island regions are typically of a mean size <250 μm and the ratio between the mean island size and the width of the interruptions is between 5 and 200.

In the FIG. 11 embodiment the island regions 114 can be metallised and the background region characterised by the raster lines 114r can be demetallised, or vice-versa.

The invention claimed is:

1. A multi-layer body comprising:
a replication layer having a first surface defined by a plurality of microscopic pattern regions and a background region surrounding or delimiting completely each of the pattern regions, wherein the pattern regions are arranged in a one-dimensional or two-dimensional grid having a grid width (D) in the range of between 5 μm and 300 μm, and the pattern regions are respectively arranged separated from each other at a spacing (B) by the background region, the ratio of the width (D) to the spacing (B) being in the range of between 5 and 200, and wherein each of the plurality of microscopic pattern regions are formed by a diffractive first relief surface structure shaped in the first surface of the replication layer; and
a first metallic layer uniformly disposed on each diffractive first relief structure to form fully metallized microscopic pattern regions, wherein the metallic layer is not applied in the background region to form a fully demetallized background region,
wherein the fully metallized microscopic pattern regions form island-shaped pattern regions, which together with the background region, appear as a homogenous metallic surface to the naked eye.

2. A multi-layer body according to claim 1, wherein the background region is formed by a second surface structure shaped in the replication layer, wherein the first and second surface structures are formed by different surface structures.

3. A multi-layer body according to claim 2, wherein the first surface structure and the second surface structure have a different depth-to-width ratio.

4. A multi-layer body according to claim 2, wherein the first surface structure and/or the second surface structure is an optical-diffraction surface structure.

5. A multi-layer body according to claim 2, wherein the first surface structure and/or the second surface structure is a matt structure.

6. A multi-layer body according to claim 1, wherein the pattern regions and/or the background region are structured in the form of a microtext or a micrographic.

7. A multi-layer body according to claim 1, wherein the pattern regions and/or the background region are sub-structured in the form of a concealed pattern which can be seen through a moiré verifier.

8. A multi-layer body according to claim 1, wherein the multi-layer body further includes at least one transparent or opaque colored layer.

9. A multi-layer body according to claim 8, wherein the at least one transparent or opaque colored layer is in the form of an electrically conductive or electrically insulating layer.

10. A multi-layer body according to claim 8, wherein the at least one transparent or opaque colored layer is of a patterned configuration.

11. A multi-layer body according to claim 8, wherein the at least one transparent or opaque colored layer comprises a first transparent or opaque colored layer of a first color and a second transparent or opaque colored layer of a second color that is different from the first color.

12. A multi-layer body comprising:
a replication layer having a first surface defined by a plurality of microscopic pattern regions and a background region surrounding or delimiting completely each of the pattern regions, wherein the pattern regions are arranged in a one-dimensional or two-dimensional grid having a grid width (D) in the range of between 5 μm and 300 μm, and the pattern regions are respectively arranged separated from each other at a spacing (B) by the background region, the ratio of the width (D) to the spacing (B) being in the range of between 5 and 200, and wherein each of the plurality of microscopic pattern regions are formed by a diffractive first relief surface structure shaped in the first surface of the replication layer; and
a first metallic layer uniformly disposed on the background region to form a fully metallized background region, wherein the metallic layer is not applied to any diffractive first relief structure to form fully demetallized microscopic pattern regions,
wherein the fully demetallized microscopic pattern regions form island-shaped pattern regions, which together with the background region, appear as a transparent film to the naked eye.

13. A multi-layer body according to claim 12, wherein the background region is formed by a second surface structure shaped in the replication layer, wherein the first and second surface structures are formed by different surface structures.

14. A multi-layer body according to claim 13, wherein the first surface structure and the second surface structure have a different depth-to-width ratio.

15. A multi-layer body according to claim 13, wherein the first surface structure and/or the second surface structure is an optical-diffraction surface structure.

16. A multi-layer body according to claim 13, wherein the first surface structure and/or the second surface structure is a matt structure.

17. A multi-layer body according to claim 12, wherein the pattern regions and/or the background region are structured in the form of a microtext or a micrographic.

18. A multi-layer body according to claim 12, wherein the pattern regions and/or the background region are sub-structured in the form of a concealed pattern which can be seen through a moiré verifier.

19. A multi-layer body according to claim 12, wherein the multi-layer body further includes at least one transparent or opaque colored layer.

20. A multi-layer body according to claim 19, wherein the at least one transparent or opaque colored layer is in the form of an electrically conductive or electrically insulating layer.

21. A multi-layer body according to claim 19, wherein the at least one transparent or opaque colored layer is of a patterned configuration.

22. A multi-layer body according to claim 19, wherein the at least one transparent or opaque colored layer comprises a first transparent or opaque colored layer of a first color and a second transparent or opaque colored layer of a second color that is different from the first color.

23. A multi-layer body comprising:
a replication layer having a first surface defined by a plurality of microscopic pattern regions and a background region surrounding or delimiting completely each of the pattern regions, wherein the pattern regions are arranged in a one-dimensional or two-dimensional grid having a grid width (D) in the range of between 5 μm and 300 μm, and the pattern regions are respectively arranged separated from each other at a spacing (B) by the background region, the ratio of the width (D) to the spacing (B) being in the range of between 5 and 200, and wherein the background region is formed by a diffractive first relief surface structure shaped in the first surface of the replication layer; and
a first metallic layer uniformly disposed on each microscopic pattern region to form fully metallized microscopic pattern regions, wherein the metallic layer is not applied in the background region to form a fully demetallized background region,
wherein the fully metallized microscopic pattern regions form island-shaped pattern regions, which together with the background region, appear as a homogenous metallic surface to the naked eye.

24. A multi-layer body according to claim 23, wherein each of the plurality of microscopic pattern regions are formed by a diffractive second relief surface structure shaped in the replication layer, wherein the first and second surface structures are formed by different surface structures.

25. A multi-layer body according to claim 24, wherein the first surface structure and the second surface structure have a different depth-to-width ratio.

26. A multi-layer body according to claim 24, wherein the first surface structure and/or the second surface structure is an optical-diffraction surface structure.

27. A multi-layer body according to claim 24, wherein the first surface structure and/or the second surface structure is a matt structure.

28. A multi-layer body according to claim 23, wherein the pattern regions and/or the background region are structured in the form of a microtext or a micrographic.

29. A multi-layer body according to claim 23, wherein the pattern regions and/or the background region are sub-structured in the form of a concealed pattern which can be seen through a moiré verifier.

30. A multi-layer body according to claim 23, wherein the multi-layer body further includes at least one transparent or opaque colored layer.

31. A multi-layer body according to claim 30, wherein the at least one transparent or opaque colored layer is in the form of an electrically conductive or electrically insulating layer.

32. A multi-layer body according to claim 30, wherein the at least one transparent or opaque colored layer is of a patterned configuration.

33. A multi-layer body according to claim 30, wherein the at least one transparent or opaque colored layer comprises a first transparent or opaque colored layer of a first color and a second transparent or opaque colored layer of a second color that is different from the first color.

34. A multi-layer body comprising:
a replication layer having a first surface defined by a plurality of microscopic pattern regions and a background region surrounding or delimiting completely each of the pattern regions, wherein the pattern regions are arranged in a one-dimensional or two-dimensional grid having a grid width (D) in the range of between 5 μm and 300 μm, and the pattern regions are respectively arranged separated from each other at a spacing (B) by the background region, the ratio of the width (D) to the spacing (B) being in the range of between 5 and 200, and wherein the background region is formed by a diffractive first relief surface structure shaped in the first surface of the replication layer; and
a first metallic layer uniformly disposed on the background region to form a fully metallized background region, wherein the metallic layer is not applied to any microscopic pattern regions to form fully demetallized microscopic pattern regions,
wherein the fully demetallized microscopic pattern regions form island-shaped pattern regions, which together with the background region, appear as a transparent film to the naked eye.

35. A multi-layer body according to claim 34, wherein each of the plurality of microscopic pattern regions are formed by a diffractive second relief surface structure shaped in the replication layer, wherein the first and second surface structures are formed by different surface structures.

36. A multi-layer body according to claim 35, wherein the first surface structure and the second surface structure have a different depth-to-width ratio.

37. A multi-layer body according to claim 35, wherein the first surface structure and/or the second surface structure is an optical-diffraction surface structure.

38. A multi-layer body according to claim 35, wherein the first surface structure and/or the second surface structure is a matt structure.

39. A multi-layer body according to claim 34, wherein the pattern regions and/or the background region are structured in the form of a microtext or a micrographic.

40. A multi-layer body according to claim 34, wherein the pattern regions and/or the background region are sub-structured in the form of a concealed pattern which can be seen through a moiré verifier.

41. A multi-layer body according to claim 34, wherein the multi-layer body further includes at least one transparent or opaque colored layer.

42. A multi-layer body according to claim 41, wherein the at least one transparent or opaque colored layer is in the form of an electrically conductive or electrically insulating layer.

43. A multi-layer body according to claim 41, wherein the at least one transparent or opaque colored layer is of a patterned configuration.

44. A multi-layer body according to claim 41, wherein the at least one transparent or opaque colored layer comprises a first transparent or opaque colored layer of a first color and a second transparent or opaque colored layer of a second color that is different from the first color.

45. A multi-layer body according to claim 4, wherein the optical-diffraction surface structure is a hologram.

46. A multi-layer body according to claim 15, wherein the optical-diffraction surface structure is a hologram.

47. A multi-layer body according to claim 26, wherein the optical-diffraction surface structure is a hologram.

48. A multi-layer body according to claim 37, wherein the optical-diffraction surface structure is a hologram.

* * * * *